(12) United States Patent
Hsieh

(10) Patent No.: US 11,569,290 B2
(45) Date of Patent: Jan. 31, 2023

(54) SENSING DEVICE AND DISPLAY APPARATUS INCLUDING THE SAME

(71) Applicant: In-Cha Hsieh, Sinfon Township (TW)

(72) Inventor: In-Cha Hsieh, Sinfon Township (TW)

( * ) Notice: Subject to any disclaimer, the term of this patent is extended or adjusted under 35 U.S.C. 154(b) by 0 days.

(21) Appl. No.: 16/371,263

(22) Filed: Apr. 1, 2019

(65) Prior Publication Data

US 2019/0305034 A1 Oct. 3, 2019

(30) Foreign Application Priority Data

Apr. 3, 2018 (TW) ................................ 107111937

(51) Int. Cl.
| | | |
|---|---|---|
| H01L 27/146 | (2006.01) | |
| G02B 5/20 | (2006.01) | |
| G06F 3/044 | (2006.01) | |
| G02F 1/1333 | (2006.01) | |

(52) U.S. Cl.
CPC ........ *H01L 27/14678* (2013.01); *G02B 5/208* (2013.01); *G06F 3/044* (2013.01); *H01L 27/14612* (2013.01); *H01L 27/14621* (2013.01); *H01L 27/14623* (2013.01); *H01L 27/14627* (2013.01); *H01L 27/14645* (2013.01); *H01L 27/14649* (2013.01); *G02F 1/13338* (2013.01)

(58) Field of Classification Search
CPC ......... H01L 27/14625; H01L 27/14621; H01L 27/14609; H01L 27/1461; H01L 27/14612; H01L 27/14669; H01L 27/14678; H01L 27/323; G06F 3/0412
See application file for complete search history.

(56) References Cited

U.S. PATENT DOCUMENTS

| | | | |
|---|---|---|---|
| 2007/0263129 A1* | 11/2007 | Park ...................... | G06F 3/0412 349/12 |
| 2013/0270618 A1* | 10/2013 | Fan ...................... | H01L 27/1462 438/66 |
| 2018/0069048 A1* | 3/2018 | Wu .................... | H01L 27/14636 |
| 2018/0233531 A1* | 8/2018 | Huang ............... | H01L 27/14623 |
| 2018/0247100 A1* | 8/2018 | Zhu ..................... | G06V 40/1318 |
| 2019/0012512 A1* | 1/2019 | He ....................... | G06K 9/0004 |

* cited by examiner

*Primary Examiner* — Jesse Y Miyoshi
(74) *Attorney, Agent, or Firm* — Hamre, Schumann, Mueller & Larson, P.C.

(57) ABSTRACT

A sensing device includes a light-transmissible substrate, a light-transmissible electrode unit connected thereto, including multiple electrically independent electrode lines, and a light sensing unit connected to the light-transmissible substrate and the light-transmissible electrode unit. The light sensing unit includes a plurality of light sensors for sensing a light transmitted from the light-transmissible substrate. The light sensors are confined within the light-transmissible electrode unit and are electrically connectable to an outer component through the light-transmissible electrode unit.

12 Claims, 11 Drawing Sheets

SENSING DEVICE AND DISPLAY APPARATUS INCLUDING THE SAME

CROSS-REFERENCE TO RELATED APPLICATION

This application claims priority of Taiwanese Patent Application No. 107111937, filed on Apr. 3, 2018.

FIELD

The disclosure relates to a sensing device and a display apparatus including the same, and more particularly to a sensing device including multiple light sensors and a display apparatus having light sensing capability.

BACKGROUND

Image sensing technology generally utilizes an image sensor to sense a target object, followed by displaying the image of the target object on a display monitor. Take recently popular motion sensing games for example, a motion sensing device used for the games typically includes a visible light (or RGB) camera, an infrared light source and an infrared sensor to perform sensing and displaying of image information to achieve motion sensing.

In order to provide more variety to sensor displays and achieve more precise sensing outcome, U.S. Patent Application Publication No. US 20100045811 A1 discloses an image apparatus that includes a plurality of light reception sensors that are directly formed on pixel areas of a display, such that the image apparatus possesses both displaying and sensing capabilities without needing to connect to an external sensor unit. Moreover, U.S. Patent Application Publication No. US 20140092052 A1 discloses a touch device that includes force sensitive sensors and capacitive sensors to achieve multiple sensing modes and higher sensing precision. Furthermore, U.S. Pat. No. 9,589,170 B2 discloses an information detection and display apparatus that has capabilities of displaying and sensing. The information detection and display apparatus includes a protective layer, a display screen, and an optical sensor sandwiched therebetween. The optical sensor includes a transparent substrate and an optical fingerprint imaging array disposed thereon. The optical fingerprint imaging array includes a plurality of signal lines and a plurality of drive lines that cooperate with the signal lines to define a plurality of imaging pixels. Each of the imaging pixels includes a signal control switch device and a photosensitive device.

SUMMARY

Therefore, a first aspect of this disclosure is to provide a sensing device that includes a light-transmissible substrate, a light-transmissible electrode unit and a light sensing unit. The light-transmissible electrode unit is connected to the light-transmissible substrate, includes a plurality of electrically independent electrode lines. The light sensing unit is connected to the light-transmissible substrate and the light-transmissible electrode unit so as to be confined within the light-transmissible electrode unit. The light sensing unit includes a plurality of light sensors for sensing a light transmitted from the light-transmissible substrate, and is electrically connectable to an outer component through the light-transmissible electrode unit.

According to a second aspect of this disclosure, a display apparatus is provided. The display apparatus includes a display unit and the sensing device of the first aspect. The display unit includes a plurality of scan lines and a plurality of data lines that cooperate with the scan lines to define a plurality of pixel areas. The display unit further includes a display side. The sensing device is mounted to the display side in such a manner that the light sensing unit faces the display side. The light transmitted from the light-transmissible substrate originates from one of ambient light and a light source unit mounted to the light-transmissible substrate.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
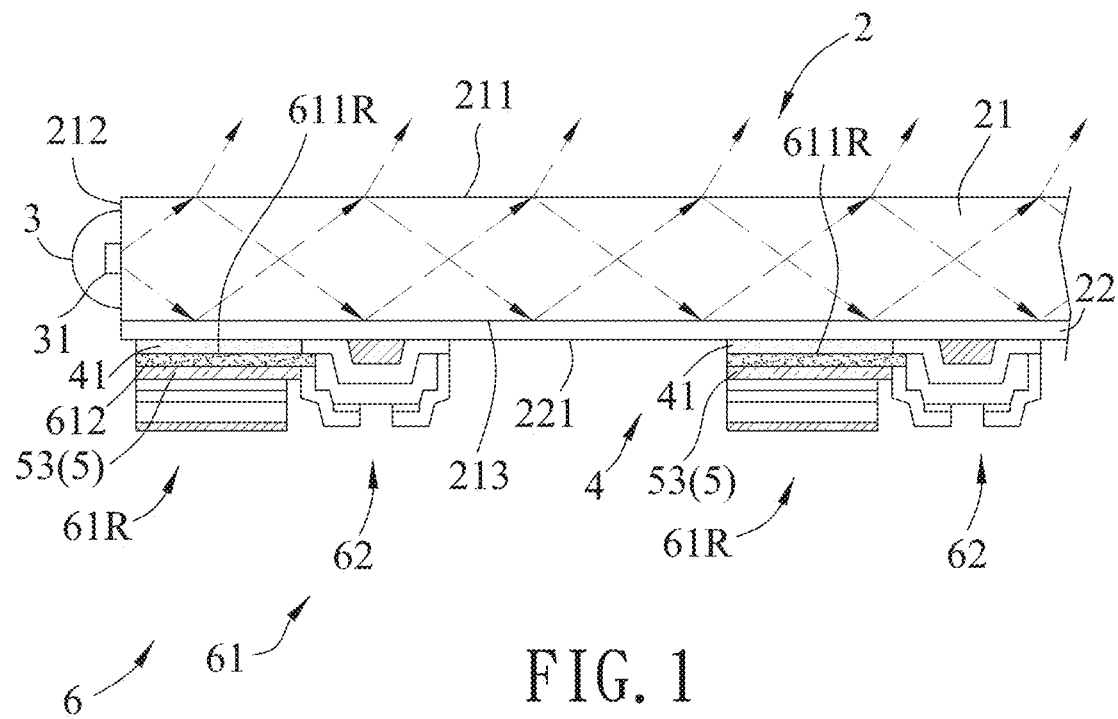
FIG. 1 is a fragmentary schematic view of an embodiment of a sensing device according to the present disclosure.

Before the disclosure is described in more detail, it should be noted that where considered appropriate, reference numerals or terminal portions of reference numerals have been repeated among the figures to indicate corresponding or analogous elements, which may optionally have similar characteristics.

A display apparatus according to the present disclosure may be used in different applications, including in touch-control systems such as touch screens, 3D image sensing systems, camera, artificial vision systems, scanners, etc.

Referring to FIG. 1, an embodiment of a sensing device of the disclosure is illustrated. The sensing device includes a light-transmissible substrate 2, a light-transmissible electrode unit 5 and a light sensing unit 6. The light-transmissible electrode unit 5 is connected to the light-transmissible substrate 2, includes a plurality of electrically independent electrode lines 53. The light sensing unit 6 is connected to the light-transmissible substrate 2 and the light-transmissible electrode unit 5. The light sensing unit 6 includes a plurality of light sensors 61 for sensing a light transmitted from the light-transmissible substrate 2. The light sensors 61 are confined within the light-transmissible electrode unit 5 and are electrically connectable to an outer component (not shown) through the light-transmissible electrode unit 5.

In this embodiment, the light-transmissible substrate 2 includes a main body 21 that has an upper surface 211, a lower surface 213 that is opposite to the upper surface 211 and that is connected to the light-transmissible electrode unit 5, and a surrounding surface 212 that interconnects the upper and lower surfaces 211, 213. The main body 21 may be made of a light-transmissible material such as glass or a polymer, which may be selected from polycarbonate (PC), poly(methyl methacrylate) (PMMA), polyethylene terephthalate (PET), polystyrene (PS), polyimide, etc. In certain embodiments, the main body 21 is flexible.

In this embodiment, the substrate 2 further includes a first low refractivity layer 22 that is formed between the lower surface 213 of the main body 21 and the light-transmissible electrode unit 5. The first low refractivity layer 22 has a bottom surface 221 that is opposite to the main body 21, and may be a nano-porous thin film made of a material selected from silicon dioxide ($SiO_2$), calcium fluoride ($CaF_2$), etc.

In this embodiment, the sensing device further includes a light source unit 3 that is mounted to the surrounding surface 212 of the main body 21 and that includes at least one light source 31 to emit the light into the main body 21.

The first low refractivity layer 22 has a refractive index lower than that of the main body 21 such that the light emitted by the light source 31 is reflected by the first low refractivity layer 22 and is confined in the main body 21, preventing the light from passing the first low refractivity layer 22 and being detected by the light sensing unit 6. When a user touches the upper surface 211 of the main body 21, a part of the light would be reflected at the touch point, then pass through the first low refractivity layer 22, and finally be received by the light sensing unit 6, achieving sensing of such touch action. The light source unit 3 may be configured to emit the light with different wavelengths. For example, the light source unit 3 may emit visible light, infrared light, a microwave, etc., as long as the light sensing unit 6 is configured to be able to receive the light emitted by the light source unit 3.

In this embodiment, the light source 31 of the light source unit 3 is capable of emitting infrared light. The light sensors 61 include a plurality of infrared light sensors 61R that are capable of receiving the infrared light emitted from the light source 31. The sensing device further includes a light-shielding layer 4 connected to the bottom surface 221 of the first low refractivity layer 22 and including multiple infrared filtering portions 41. Each of the infrared filtering portions 41 is visible-light intransmissible and infrared-light transmissible and covers a light incident surface 611R of a corresponding one of the infrared light sensors 61R. Each of the infrared light sensors 61R is made of a material selected from single crystalline silicon, amorphous silicon, nanocrystalline silicon, polycrystalline silicon, oxide semiconductors or is made of an organic or inorganic light emitting diode having a bandgap smaller than 1.12 eV.

In this embodiment, the light sensing unit 6 further includes a plurality of control switches 62 that are respectively and electrically connected to the light sensors 61. Each of the control switches 62 is operable to control the respective one of the light sensors 61 and is one of a thin film transistor selected from oxide semiconductor thin film transistor (e.g., indium gallium zinc oxide thin film transistor), organic thin film transistor, polycrystalline silicon thin film transistor and amorphous silicon thin film transistor, and an integrated circuit.

A plurality of insulating layers 612 may be respectively formed on the infrared filtering portions 41, then respectively connected to the electrode lines 53 to achieve overall flatness of the sensing device.

In this embodiment, the light-transmissible electrode unit 5 is disposed between the light-transmissible substrate 2 and the light sensing unit 6, and the electrode lines 53 may be aligned according to practical requirements. Alternatively, depending on the adopted manufacturing technique, the electrode lines 53 of the light-transmissible electrode unit 5 may be respectively formed on the light sensors 61 opposite to the main body 21 of the light-transmissible substrate 2.

The light-transmissible electrode unit 5 may be made of metal or electrically conductive metal oxide (e.g., indium tin oxide (ITO)), as long as electrical connection can be achieved without hindering passage of the light.

Figure 2:
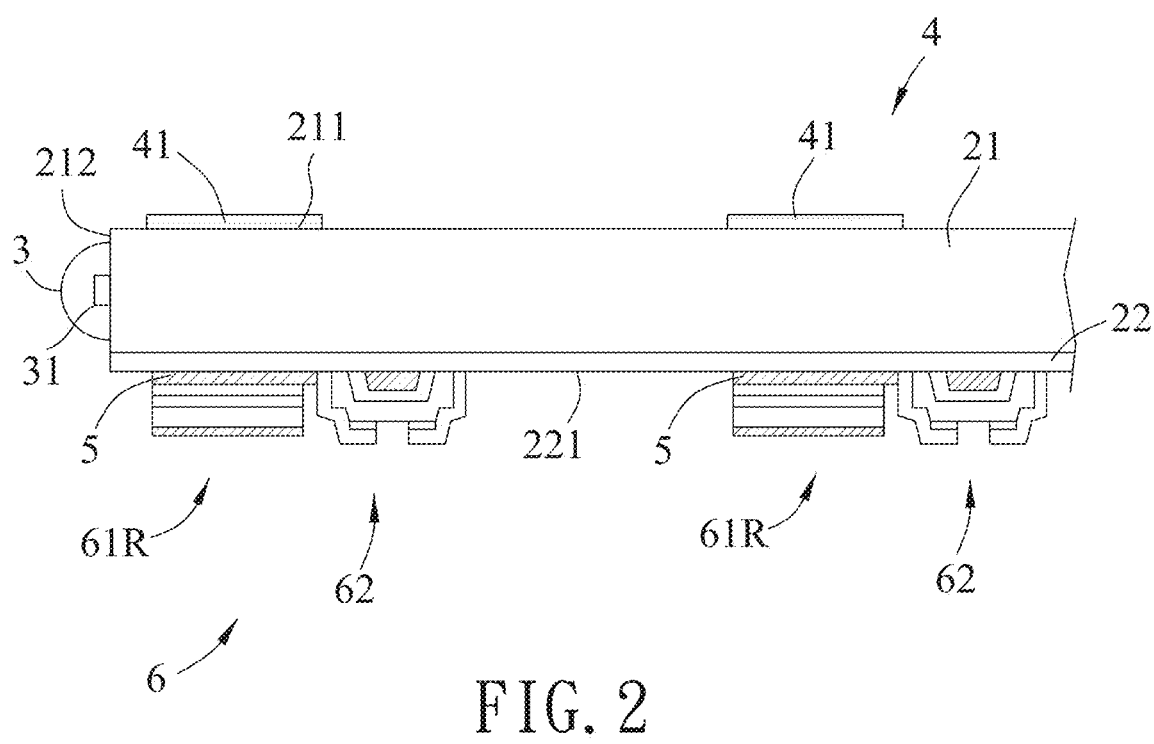
FIGS. 2 and 3 are fragmentary schematic views illustrating alternative configurations of the sensing device.

Referring to FIG. 2, alternatively, the light-shielding layer 4 is connected to the upper surface 211 of the main body 21 of the substrate 2. Therefore, the light-transmissible electrode unit 5 is directly formed on the bottom surface 221 of the first low refractivity layer 22.

Figure 3:
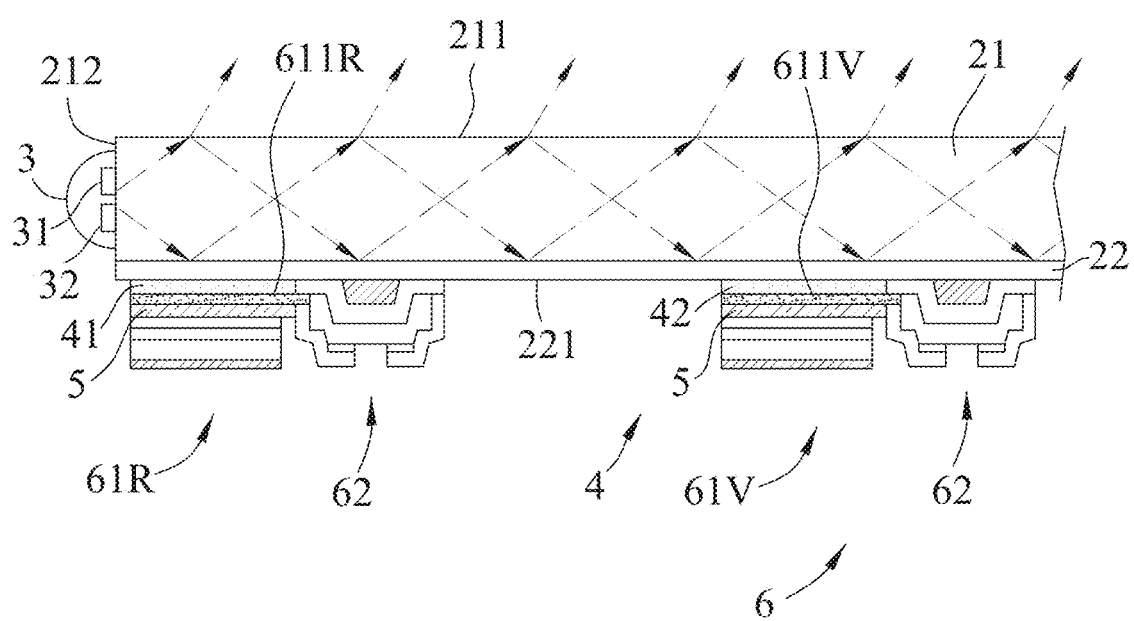

Referring to FIG. 3, alternatively, the light source unit 3 includes two of the light sources that are respectively an infrared light source 31 and a visible light source 32. The light sensors 61 include a plurality of the infrared light sensors 61R that are capable of receiving infrared light generated by the infrared light source 31, and a plurality of visible light sensors 61V that are capable of receiving visible light generated by the visible light source 32. The light-shielding layer 4 includes a plurality of the infrared filtering portions 41, each of which covers the light incident surface 611R of the corresponding one of the infrared light sensors 61R, and a plurality of color filtering portions 42, each of which is visible-light transmissible and covers a light incident surface 611V of a corresponding one of the visible light sensors 61V.

Each of the color filtering portions 42 is made of a material that allows passage of a visible light with particular wavelength (e.g., either one of red light, green light and blue light). In other words, each of the visible light sensors 61V is either one of a red light sensor, a green light sensor and a blue light sensor and is capable of receiving a corresponding type of the visible light.

Figure 4A:
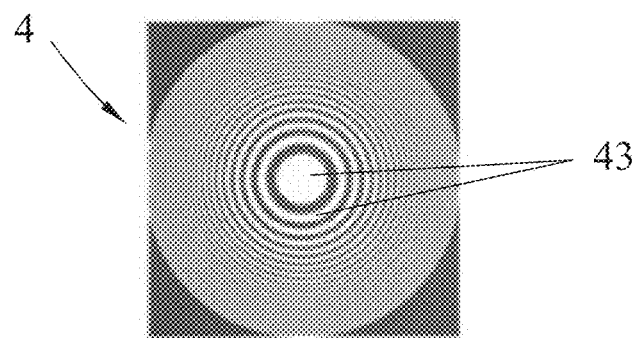
FIGS. 4(A) to 4(C) are schematic views showing different configurations of a light-shielding layer applicable to the sensing device of this disclosure.
Figure 4B:
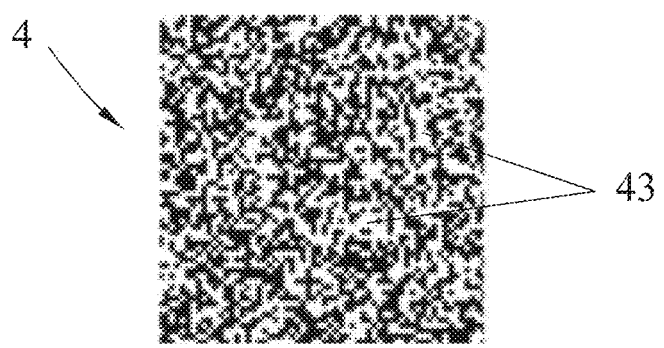
Figure 4C:
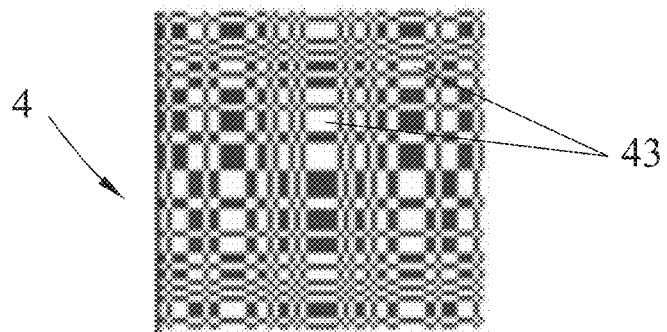

Referring to FIGS. 2 and 4(A) to 4(C), in the embodiments where the light-shielding layer 4 is connected to the upper surface 211 of the main body 221 of the substrate 2, the light-shielding layer 4 may be formed with a plurality of through holes 43 for diffracting light passing therethrough to form a diffraction pattern on the light sensors 61, and allowing the sensing device to be applied as a camera with enhanced image resolution. The through holes 43 of the light-shielding layer 4 may have variable dimension, shape and arrangements as shown in FIGS. 4(A) to 4(C), and may be changed according to practical requirements. In certain embodiments, the light-shielding layer 4 may be made of a light impenetrable material or a visible-light intransmissible material.

Figure 5:
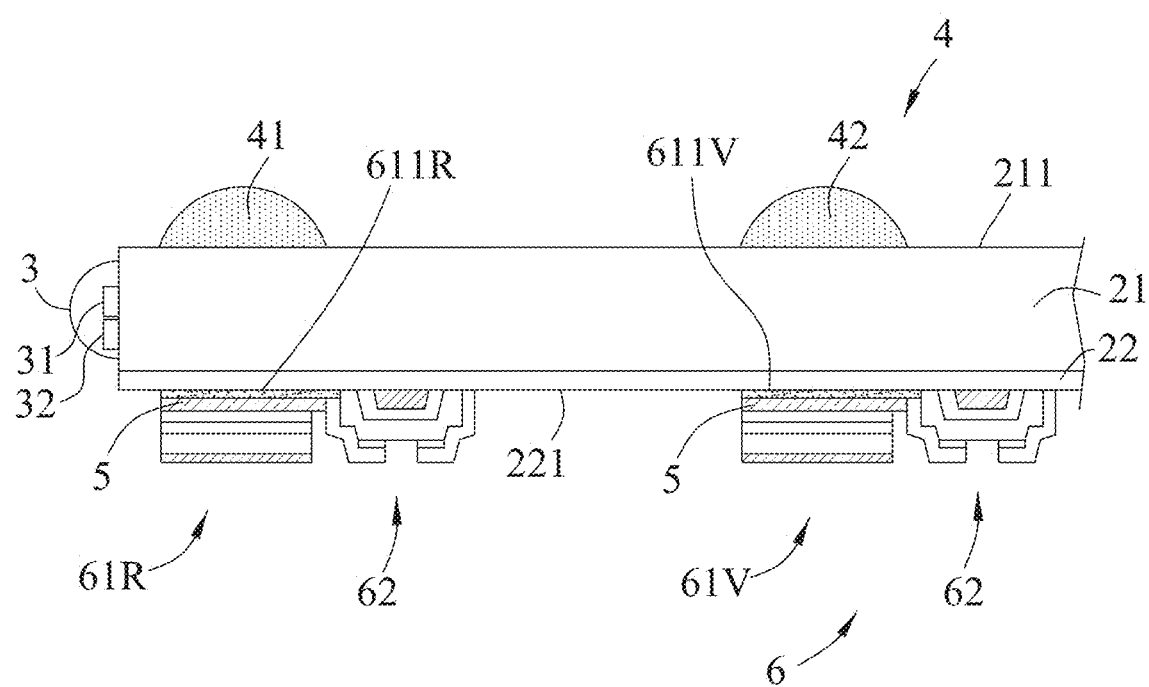
FIGS. 5 to 13 are fragmentary schematic views illustrating other alternative configurations of the sensing device.

Referring to FIG. 5, alternatively, when the light-shielding layer 4 is connected to the upper surface 211 of the main body 21 of the substrate 2, a portion of the multiple infrared filtering portions 41 (only one is shown in FIG. 5) and a portion of the multiple color filtering portions 42 (only one is shown in FIG. 5) are microlens-shaped, which concentrate the light toward the light sensing unit 6, resulting in improved sensing sensitivity. Each of the infrared filtering portions 41 and the color filtering portions 42 may correspond to one or more of the infrared and visible light sensors 61R, 61V, and the infrared filtering portions 41 and the color filtering portions 42 may be arranged in an array based on practical requirements.

Figure 6:
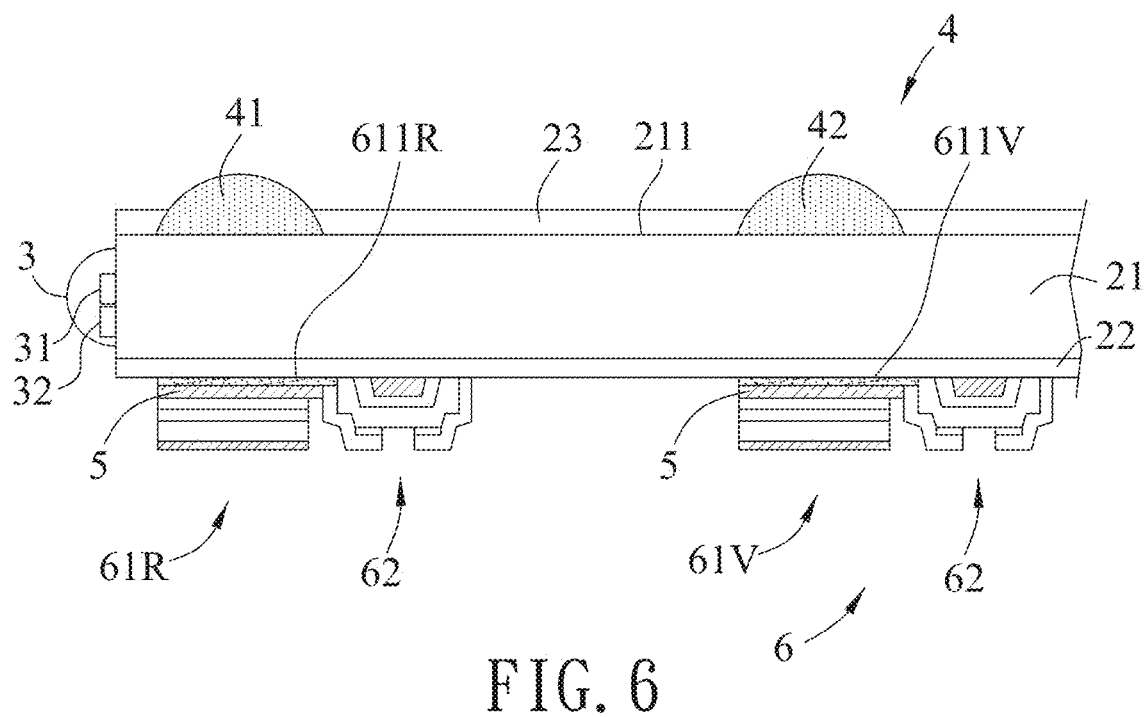

Referring to FIG. 6, alternatively, the sensing device may further include a second low refractivity layer 23 that has a refractive index lower than that of the main body 21. The second low refractivity layer 23 is formed on a portion of the upper surface 211 of main body 21 not covered by the infrared filtering portions 41 and the color filtering portions 42 to prevent additional elements (e.g., protective film, which is not shown in the figure) disposed on the upper surface 211 of the main body 21 from affecting the optical property of the sensing device (i.e., the path of the light through the sensing device). The second low refractivity layer 23 may be made from a material the same as or different from that of the first low refractivity layer 22.

Figure 7:
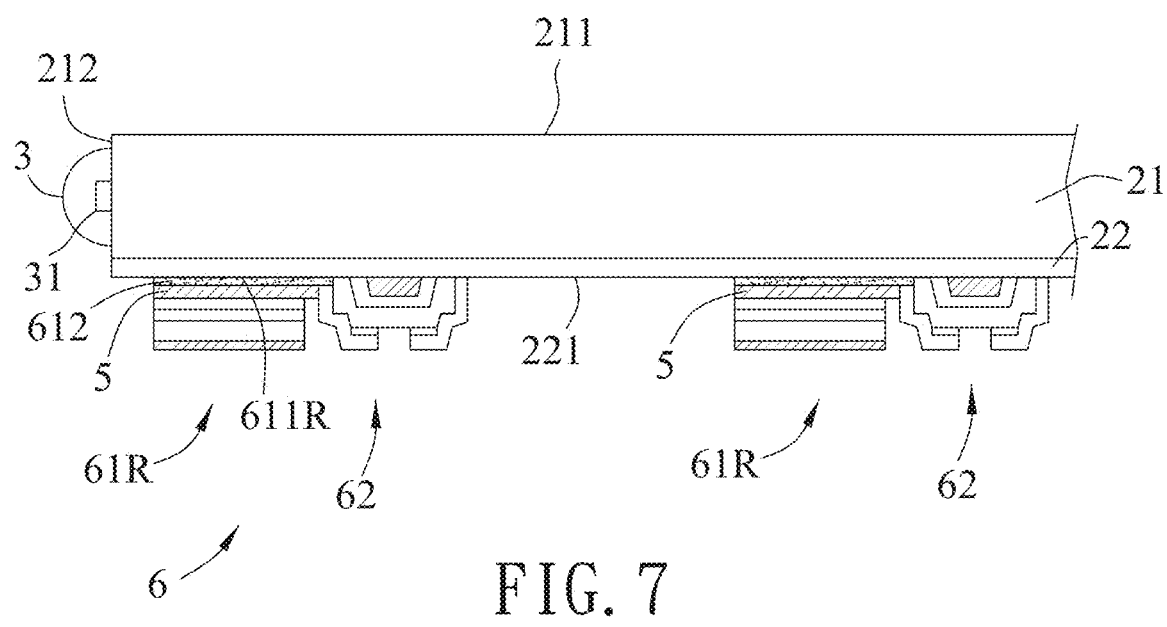

Referring to FIG. 7, alternatively, the light-shielding layer 4 shown in the abovementioned drawings may be omitted. Therefore, the light passes through the main body 21 and the first low refractivity layer 22 and is directly received by the light sensing unit 6.

Figure 8:
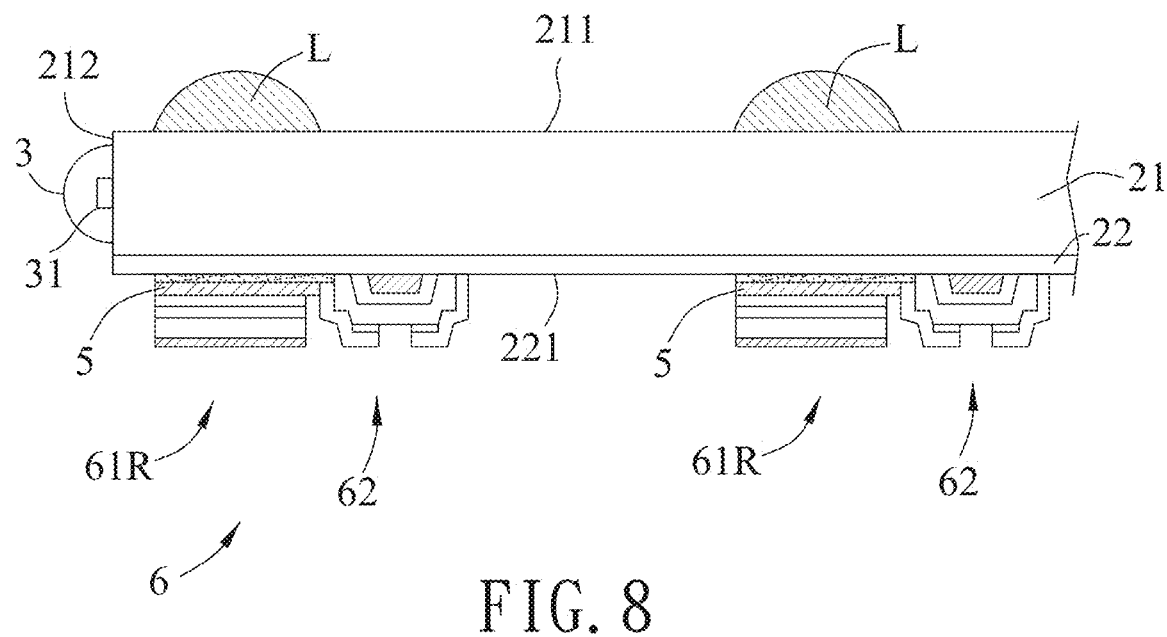

Alternatively, when the light-shielding layer 4 is formed on the bottom surface 221 of the first low refractive layer 22 or when the light-shielding layer 4 is omitted as shown in FIG. 8, the sensing device further includes a plurality of microlenses (L) that are light-transmissible and that are disposed on the upper surface 211 of the main body 21 of the substrate 2. Each of the microlenses (L) may correspond to one or more of the light sensors 61, and the microlenses (L) may be arranged in an array on the upper surface 211 of the main body 21 to be applied to a 3D camera or the like.

Figure 9:
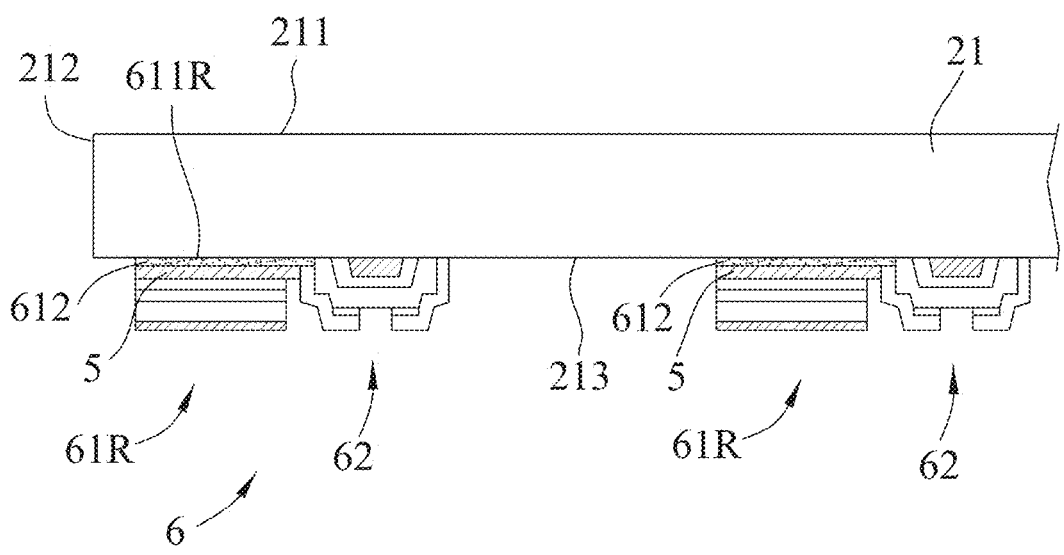

Referring to FIG. 9, alternatively, the light source unit 3, the light-shielding layer 4 and the first low refractivity layer 22 are omitted, and the sensing device is adapted for sensing ambient light (i.e., the light transmitted from the light-transmissible substrate 2 to the light sensing unit 6 originating from the ambient light), external light source (e.g., visible light, infrared light, etc.), micro projector or external display. The external display may be LED display panel, micro LED display panel, OLED display panel, etc. It should be noted that only the infrared light sensors 61R are shown in FIG. 9, but the visible light sensors 61V may also be provided alone or in combination with the infrared light sensors 61R according to practical requirements.

Figure 10:
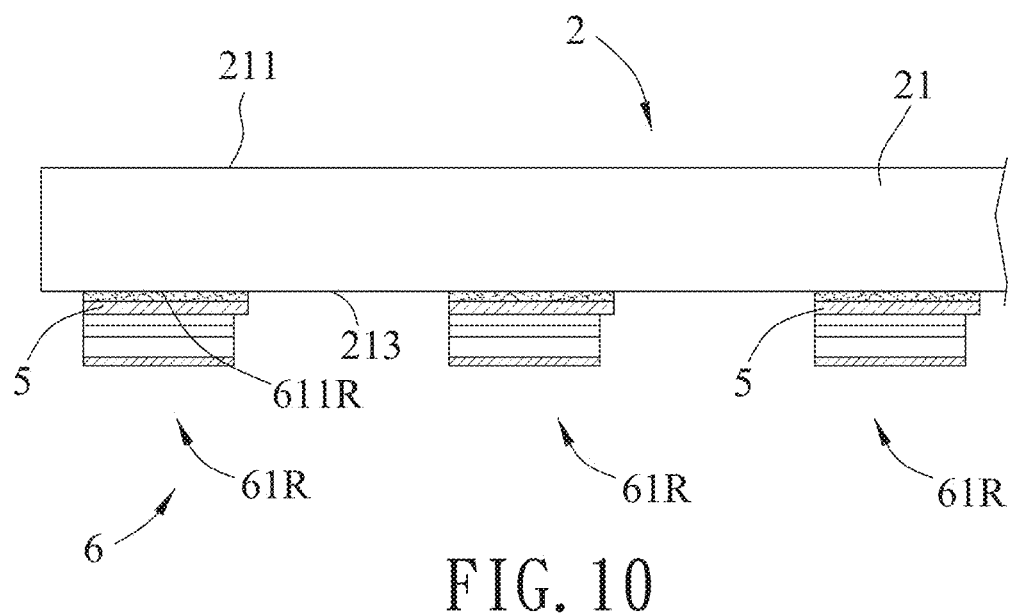

Referring to FIG. 10, alternatively, the control switches 62 of the light sensing unit 6 may be omitted, and the light sensors 61 may be connected to an external integrated circuit (not shown). The external integrated circuit may be used for controlling the light sensors 61 and processing electrical signals provided by the light sensors 61.

Figure 11:
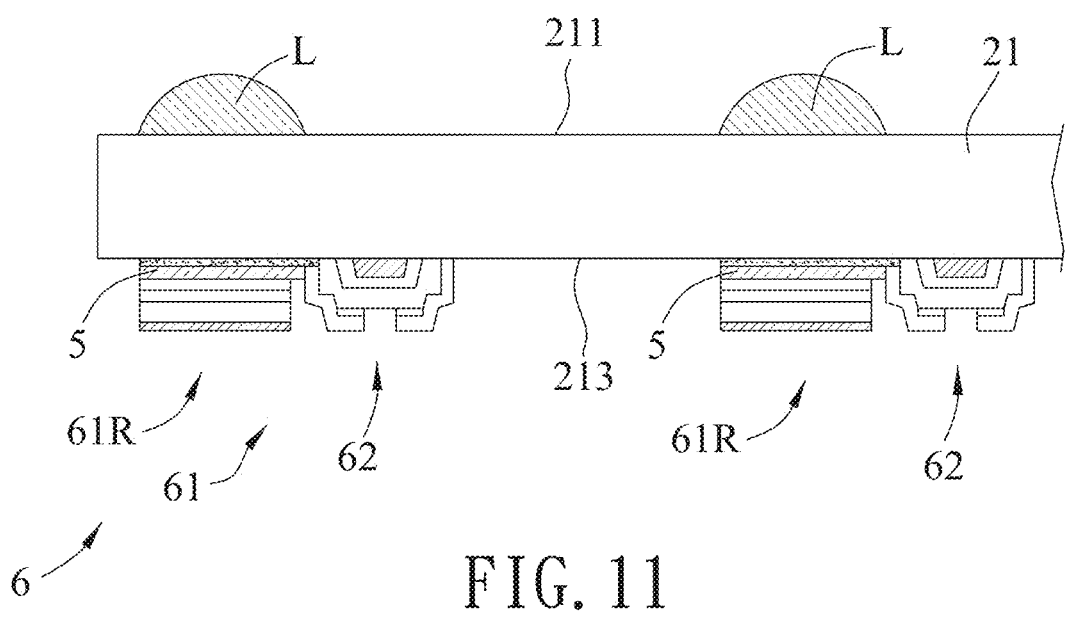

Referring to FIG. 11, in the sensing device shown in FIG. 9, the microlenses (L) may be further provided on the upper surface 211 of the main body 21 for concentrating the ambient light, facilitating entrance of the ambient light into the light sensors 61.

Figure 12:
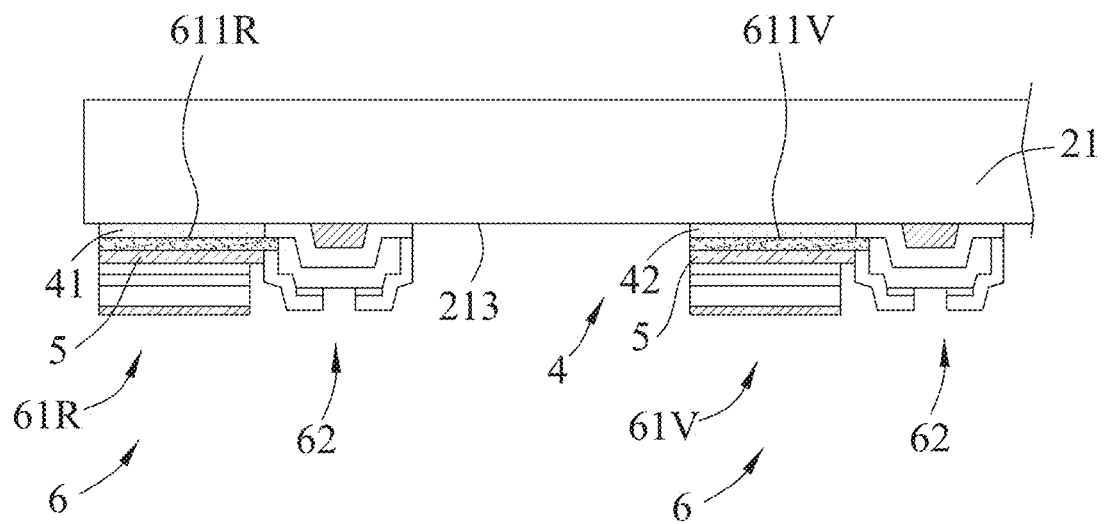

Referring to FIG. 12, an alternative configuration of the sensing device shown in FIG. 3 is illustrated, where the light source unit 3 and the first low refractivity layer 22 are omitted. The infrared filtering portions 41 and the color filtering portions 42 of the light-shielding layer 4 respectively correspond to the infrared and visible light sensors 61R, 61V. The light-shielding layer 4 may be formed with the through holes 43 as shown in FIGS. 4(A) to 4(E). In certain embodiments, the light-shielding layer 4 may be made of a light impenetrable material or a visible-light intransmissible material.

Figure 13:
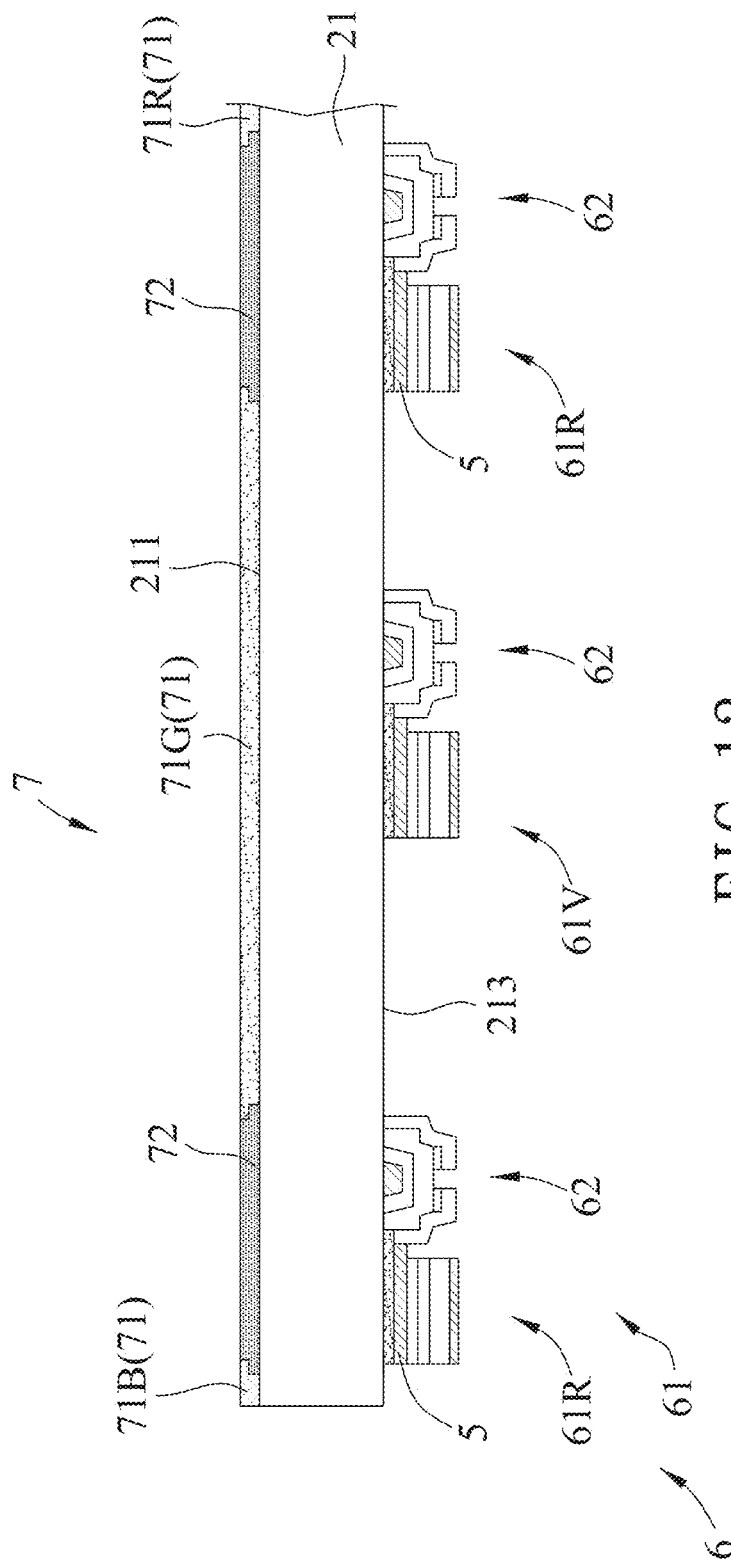

Referring to FIG. 13, an alternative configuration of the sensing device shown in FIG. 11 is illustrated, where the microlenses (L) are omitted. In this configuration, the sensing device further includes a light filtering layer 7 that is connected to the upper surface 211 of the main body 21 of the substrate 2. Alternatively, the light filtering layer 7 may be connected to the bottom surface 221 of the first low refractivity layer 22. The light filtering layer 7 has a plurality of color filtering portions 71 and a light-shielding portion 72 connecting the color filtering portions 71. Each of the color filtering portions 71 is made of a material that is visible-light transmissible. Three color filtering portions 71R, 71G, 71B shown in FIG. 13 are respectively red-light transmissible, green-light transmissible and blue-light transmissible. The light-shielding portion 72 is made of one of a material that is visible-light intransmissible and infrared-light transmissible and a light impenetrable material. The light sensors 61 include a plurality of the infrared light sensors 61R and a plurality of the visible light sensors 61V. The infrared light sensors 61R are confined within a normal projection area of the light-shielding portion 72 on the lower surface 213 of the main body 21 of the substrate 2. The visible light sensors 61V are respectively confined within a normal projection area of the color filter portions 71 on the lower surface 213 of the main body 21 of the substrate 2.

In certain embodiments, the sensing device may further include a projection unit (not shown) that is disposed on the light-transmissible substrate 2 and that is in signal communication with the light sensing unit 6. The projection unit is one of a pico projector, a dot projector, and combination thereof. Each of the pico projector and the dot projector includes an infrared light source. The dot projector further includes a plurality of microlenses that cooperate with the infrared light source to emit a plurality of infrared light points. The pico projector and/or the dot projector may be mounted to a peripheral region of the light-transmissible substrate 2. The pico projector and/or the dot projector in cooperation with the sensing device may be used in the display apparatus of a cell phone, a notebook computer, a television, etc. to display an output image from the sensing device, and may be used for 3D sensing/display, 5D television, etc.

In certain embodiments, the light sensors 61 may also cooperate with the pico projector or the dot projector to be used in light detection and ranging (LiDAR) applications.

Figure 14:
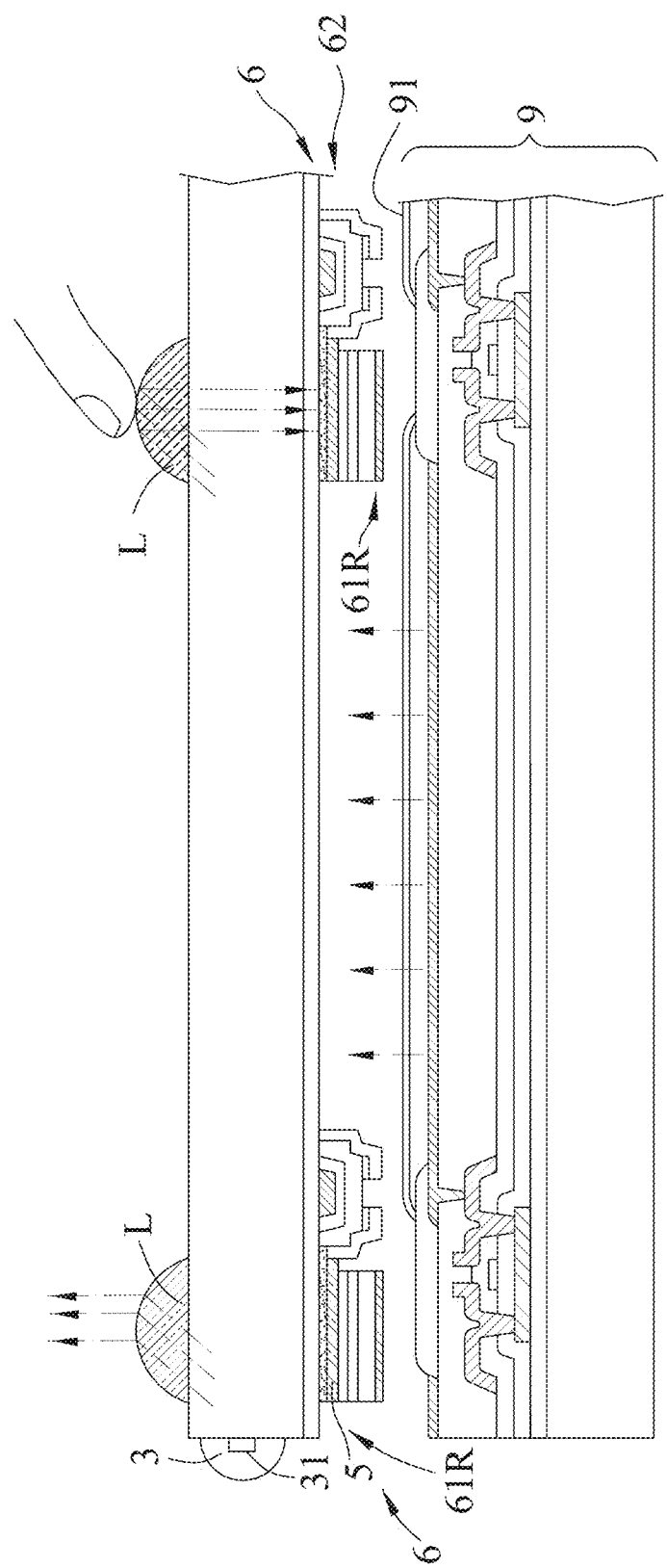
FIG. 14 is a fragmentary schematic view illustrating an embodiment of a display apparatus according to the present disclosure.
Figure 15:
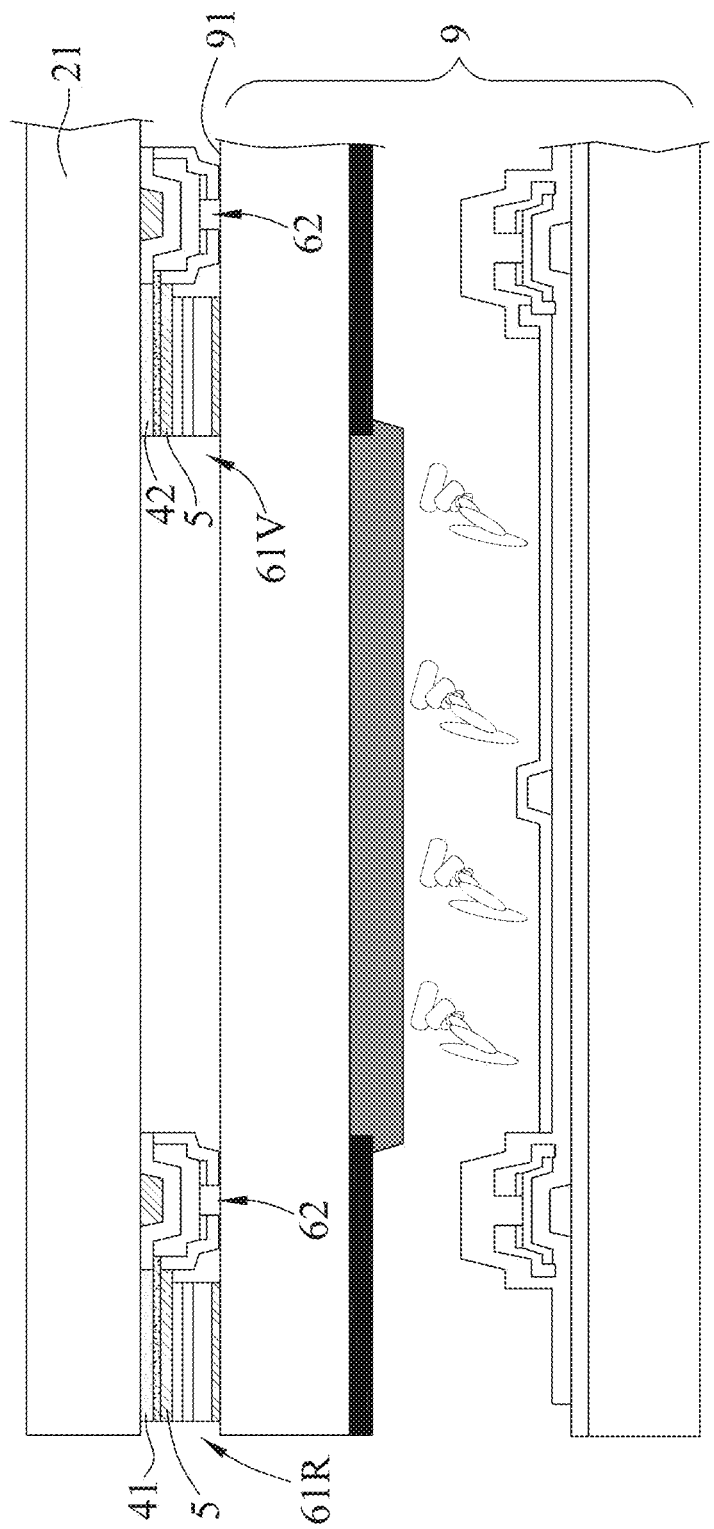
FIG. 15 is a fragmentary schematic view illustrating an alternative of the display apparatus.

Referring to FIGS. 14 and 15, the abovementioned sensing device is applicable to a display apparatus having a display unit 9. With the sensing device in combination with the display unit 9, the display apparatus can be used as a scanner, thermal image display, night vision display, facial recognition system, 5D display, etc. In FIG. 14, the display unit 9 in combination with the sensing device of FIG. 8 is exemplified as an organic light-emitting diode display. In FIG. 15, the display unit 9 in combination with the sensing device of FIG. 12 is exemplified as a liquid crystal display. It should be noted that the types of the display unit 9 may be changed according to practical requirements.

Specifically, the display unit 9 may include at least one of a liquid crystal display, a micro LED display and an organic light-emitting diode display. The liquid crystal display may use LED or micro LED as backlight source. The display unit 9 includes a plurality of scan lines (not shown), and a plurality of data lines (not shown) that cooperate with the scan lines to define a plurality of pixel areas (not shown). The display unit 9 further includes a display side 91. The sensing device is mounted to the display side 91 of the display unit 9 in such a manner that the light sensing unit 6 of the sensing device faces the display side 91 of the display unit 9. The display unit 9 is in signal communication with the sensing device through a circuit unit (not shown). The light-transmissible electrode unit 5 and the light sensing unit 6 are confined within a normal projection area of the scan lines and the data lines on the display side 91 on the display side 91 so as not to affect the aperture ratio of the display apparatus.

The larger the dimension of the sensing device or the higher the frequency of the driving signal, the stricter a noise tolerance of the display apparatus with regard to the signals generated by the light sensing unit 6. Therefore, the light sensing unit 6 may further include a plurality of amplifiers (not shown) that are respectively connected to the light sensors 61 for amplifying electrical signals generated by the light sensing unit 6. The amplifiers may be thin film transistors.

In certain embodiments, the light sensors 61 including the infrared light sensors 61R and the visible light sensors 61V may be divided into multiple infrared and RGB sensing units that can work independently without interfering with each other.

In certain embodiments, the infrared light sensors 61R may be used in combination with an infrared light source and external circuit units in infrared communication applications.

In certain embodiments, the display unit 9 may utilize liquid crystal, electrowetting devices, OLED, micro LED, etc. for controlling display thereof.

In sum, the light sensing unit 6 of this disclosure is confined within the light-transmissible electrode unit 5 so as not to interfere with the display image. Moreover, when the sensing device and the display unit 9 are working together, the light-transmissible electrode unit 5 and the light sensing unit 6 are confined within a normal projection area of the scan lines and the data lines on the display side 91 so as not to affect an aperture ratio of the display apparatus.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A sensing device, comprising:
   a light-transmissible substrate;
   a light-transmissible electrode unit, connected to said light-transmissible substrate, and comprising a plurality of electrically independent electrode lines;
   a light sensing unit, connected to said light-transmissible substrate and said light-transmissible electrode unit, said light sensing unit comprising:
     a plurality of light sensors for sensing a light transmitted from said light-transmissible substrate,
     wherein said light sensors are confined within said light-transmissible electrode unit and are electrically connectable to an outer component through said light-transmissible electrode unit,
   wherein said light-transmissible electrode unit is disposed between said light-transmissible substrate and said light sensing unit, and
   wherein said light-transmissible substrate comprises:
     a main body that has an upper surface,
     a lower surface that is opposite to said upper surface and is connected to said light-transmissible electrode unit, said light sensors of said light sensing unit being connected to said lower surface of said light-transmissible substrate through said light-transmissible electrode unit, and
     a surrounding surface that interconnects said upper and lower surfaces; and
   a light-shielding layer, connected to said upper surface of said main body of said substrate, formed with a plurality of through holes for diffracting light passing through said through holes,
   wherein
   said sensing device is configured to be mounted to a display side of a display unit such that said light sensing unit faces said display side, and
   said light-shielding layer is configured to be disposed opposite to said display unit relative to said light sensing unit.

2. The sensing device as claimed in claim 1, wherein said substrate further comprises:
   a first low refractivity layer formed between said lower surface of said main body and said light-transmissible electrode unit,
   wherein said first low refractivity layer has a refractive index lower than that of said main body, and
   wherein said first low refractivity layer has a bottom surface opposite to said main body.

3. The sensing device as claimed in claim 2, further comprising:
   a light source unit, mounted to said surrounding surface of said main body, comprising at least one light source to emit the light into said main body.

4. The sensing device as claimed in claim 3, wherein said at least one light source includes one of an infrared light source and a visible light source, said light sensors including at least one of a plurality of infrared light sensors and a plurality of visible light sensors.

5. The sensing device as claimed in claim 4, further comprising a light-shielding layer that is connected to one of said upper surface of said main body of said substrate and said bottom surface of said first low refractivity layer, said light-shielding layer including multiple infrared filtering portions, each of which is visible-light intransmissible and infrared-light transmissible and covers a light incident surface of a corresponding one of said infrared light sensors, and multiple color filtering portions, each of which is visible-light transmissible and covers a light incident surface of a corresponding one of said visible light sensors.

6. The sensing device as claimed in claim 1, wherein said light sensing unit further comprises:
   a plurality of control switches that are respectively electrically connected to said light sensors,
   wherein each of said control switches is operable to control the respective one of said light sensors and
   wherein each of said control switches is one of a thin film transistor and an integrated circuit, said thin film transistor being selected from an oxide semiconductor thin film transistor, an organic thin film transistor, a polycrystalline silicon thin film transistor, and an amorphous silicon thin film transistor.

7. A display apparatus comprising a display unit and the sensing device as claimed in claim 4, wherein said display unit including a plurality of scan lines and a plurality of data lines that cooperate with said scan lines to define a plurality of pixel areas, said display unit further including a display side, said sensing device being mounted to said display side in such a manner that said light sensing unit faces said display side.

8. The display apparatus as claimed in claim 7, wherein said light-transmissible electrode unit is confined within a normal projection area of said scan lines and said data lines on said display side.

9. The display apparatus as claimed in claim 7, wherein said display unit is one of a liquid crystal display, a micro LED display, and a OLED display.

10. A display apparatus, comprising:
a display unit; and
the sensing device as claimed in claim 1,
wherein said display unit comprises:
  a plurality of scan lines, and
  a plurality of data lines that cooperate with said scan lines to define a plurality of pixel areas, and
  a display side, wherein
  said sensing device is mounted to said display side such that said light sensing unit faces said display side, and
  said light-shielding layer is disposed opposite to said display unit relative to said light sensing unit.

11. The sensing device as claimed in claim 1, wherein said through holes are arranged in a grid-like manner.

12. The sensing device as claimed in claim 1, wherein said through holes are arranged in a concentric manner.

* * * * *